United States Patent
Petritsch et al.

(10) Patent No.: US 6,340,789 B1
(45) Date of Patent: Jan. 22, 2002

(54) MULTILAYER PHOTOVOLTAIC OR PHOTOCONDUCTIVE DEVICES

(75) Inventors: Klaus Petritsch, Cambridge (GB); Magnus Granstrom, Molnlucke (SE)

(73) Assignee: Cambridge Display Technology Limited, Cambridge (GB)

( * ) Notice: Subject to any disclaimer, the term of this patent is extended or adjusted under 35 U.S.C. 154(b) by 0 days.

(21) Appl. No.: 09/646,325

(22) PCT Filed: Feb. 2, 1999

(86) PCT No.: PCT/GB99/00349

§ 371 Date: Sep. 15, 2000

§ 102(e) Date: Sep. 15, 2000

(87) PCT Pub. No.: WO99/49525

PCT Pub. Date: Sep. 30, 1999

(30) Foreign Application Priority Data

Mar. 20, 1999 (GB) ............................................. 9806066

(51) Int. Cl.⁷ .......................... H01L 51/20; H01L 51/30; H01L 51/40; H01L 31/04
(52) U.S. Cl. ........................ 136/263; 136/255; 136/261; 136/256; 257/40; 257/431; 257/458; 438/82; 438/89; 438/57; 438/99
(58) Field of Search ................................. 136/255, 263, 136/261, 256; 257/40, 431, 458; 438/82, 89, 57, 99

(56) References Cited

U.S. PATENT DOCUMENTS

| | | | |
|---|---|---|---|
| 4,099,199 A | * | 7/1978 | Wittry ......................... 136/255 |
| 4,164,431 A | | 8/1979 | Tang |
| 4,199,383 A | | 4/1980 | Wittry ......................... 148/174 |
| 4,281,053 A | | 7/1981 | Tang |
| 5,201,961 A | | 4/1993 | Yoshikawa et al. |
| 5,331,183 A | | 7/1994 | Sariciftci et al. |
| 5,350,459 A | | 9/1994 | Suzuki et al. |
| 5,376,487 A | | 12/1994 | Ueda |
| 5,454,880 A | | 10/1995 | Saricifci et al. |
| 5,482,570 A | | 1/1996 | Saurer et al. ................ 136/255 |
| 5,518,853 A | | 5/1996 | Nguyen et al. |
| 5,532,173 A | | 7/1996 | Martin et al. |
| 5,670,791 A | | 9/1997 | Halls et al. .................... 257/40 |

FOREIGN PATENT DOCUMENTS

| | | |
|---|---|---|
| WO | WO-92/09099 A1 * | 5/1992 |
| WO | WO96/16449 | 5/1996 |
| WO | WO-96/33593 A1 * | 10/1996 |

OTHER PUBLICATIONS

G. Yu et al., "Charge Separation And Photovoltaic Conversion In Polymer Composites With Internal Donor/Acceptor Heterojunctions," Journal of Applied Physics, vol. 78, No. 7, Oct. 1, 1995, pp. 4510–4515, XP002102233, New York, US.

Halls, J.J.M. et al., "Efficient Photodiodes From Interpenetrating Polymer Networks" Nature, vol. 376, No. 5, Aug. 10, 1995, pp. 498–500, XP000578123.

G. Yu et al., "Polymer Photovoltaic Cells: Enhanced Efficiencies Via A Network Of Internal Donor–Acceptor Heterojunctions," Science, vol. 270, Dec. 15, 1995, pp. 1789–1791, XP002102234, Lancaster PA US.

(List continued on next page.)

Primary Examiner—Alan Diamond
(74) Attorney, Agent, or Firm—Finnegan, Henderson, Farabow, Garrett & Dunner, L.L.P.

(57) ABSTRACT

The invention concerns optically absorptive photonic devices and in particular photovoltaic and photoconductive devices. It is particularly concerned with devices formed from multiple semiconducting layers, e.g., organic semiconducting polymers. Such a device has two central semiconductive layers which have been laminated together so as to form a mixed layer between the first and second semiconductive layers, while retaining at least some of the first and second semiconductive layers on either side of the mixed layer.

47 Claims, 3 Drawing Sheets

OTHER PUBLICATIONS

M. Granstrom et al., "White Light Emission From A Polymer Blend Light Emitting Diode,"Applied Physics Letters, vol. 68, No. 2, Jan. 8, 1996, pp. 147–149, XP000552694.

M. Granstrom et al., "Laminated Fabrication Of Polymeric Photovoltaic Diodes," Nature, vol. 395, No. 6699, Sep. 17, 1998, pp. 257–260, XP002102235, London, GB.

Ottenbourgs et al., "Characterization of poly (isothianaphthene) Derivatives And Analogs By Using Solid–State $^{13}$C NMR,"Synthetic Metals, 89 (1997) pp. 95–102.

A.J.W. Tol, "Using Symmetry Forbidden Interactions To Create Small Band Gap Polymers: Poly–Aminosquaraine And Related Compounds," J. Chem. Phys., vol. 100, No. 11, Jun. 1, 1994, pp. 8463–8470.

Yu et al., "Optocoupler Made From Semiconducting Polymers," Journal of ELectronic Materials, vol. 23, No. 9, 1994, pp. 925–928.

Suzuki et al., "Electroluminescence From Multilayer Organic Light–Emitting Diodes Using Poly (methylphenylsilane) As Hole Transporting Material,"

Toyoshima et al., "Synthesis And Properties of Poly (thienlenevinylene Derivatives With Hexyl Groups,"Synthetic Metals 84 (1997), pp. 431–432.

C. W. Tang, "Two–Layer Organic Photovoltaic Cell,"Appl. Phys. Lett., vol. 48, No. 2, Jan. 13, 1986, pp. 183–185.

Yoshino et al., "Novel Properties Of Molecularly Doped Conducting Polymers And Junction Devices," Synthetic Metals 84 (1997), pp. 477–482.

* cited by examiner

MULTILAYER PHOTOVOLTAIC OR PHOTOCONDUCTIVE DEVICES

FIELD OF THE INVENTION

The present invention relates to optically absorptive photonic devices and in particular photovoltaic and photoconductive devices and their formation. Embodiments of the invention relate particularly to devices formed from multiple semiconducting layers, preferably composed of organic semiconducting polymers.

BACKGROUND OF THE INVENTION

Semiconductive photovoltaic devices are based on the separation of electron-hole pairs formed following the absorption of a photon. An electric field is generally used for the separation. The electric field may arise from a Schottky contact where a built-in potential exists at a metal-semiconductor interface or from a pn junction between p-type and n-type semiconductive materials. Such devices are commonly made from inorganic semiconductors especially silicon which is used in monocrystalline, polycrystalline or amorphous forms. Silicon is normally chosen because of its high conversion efficiencies and the large industrial investments which have already been made in silicon technology. However, silicon technology has associated high costs and complex manufacturing process steps resulting in devices which are expensive in relation to the power they produce.

"Two-layer organic photovoltaic cell", Applied Physics Letters 48(2), Jan. 13, 1986, C. W. Tang, U.S. Pat. No. 4,164,431 and U.S. Pat. No. 4,281,053 describe multi-layer organic photovoltaic elements. These devices are formed in a layer by layer fashion. A first organic semiconductive layer is deposited on an electrode, a second organic semiconductive layer is deposited on the first organic layer and an electrode is deposited on the second organic layer. The first and second organic semiconductive layers are electron acceptors and hole acceptors. In the following, an "electron accepting material" refers to a material which due to a higher electron affinity compared to another material is capable of accepting an electron from that material. A "hole accepting material" is a material which due to a smaller ionisation potential compared to another material is capable of accepting holes from that other material. The absorption of light in organic photoconductive materials results in the creation of bound electron-hole pairs, which need to be dissociated before charge collection can take place. The material considerations for organic devices are different compared to inorganic devices, where the electron and holes created by the absorption of a photon are only weakly bound. The dissociation of the bound electron-hole pair is facilitated by the interface between the layer of material which acts as a hole acceptor and the layer of semiconductive material which acts as an electron acceptor. The holes and electrons travel through their respective acceptor materials to be collected at the electrodes.

The designing of photovoltaic devices which are fabricated in a layer by layer fashion is limited. When one organic layer is deposited on top of another organic layer, the second layer must be added in such a way that the previously deposited layer is not affected in a detrimental way. Consequently solvents used for subsequent layers are limited in order not to dissolve the previous layer completely or destroy it in other ways. "Efficient photodiodes from interpenetrating polymer networks", Nature, vol 376, Aug. 10, 1995, page 498–500, J. J. M. Halls et al, and U.S. Pat. No. 5,670,791 describe the formation of a photovoltaic device by depositing a single layer comprising a blend of first and second semiconductive polymers and the deposition of a second electrode on top of that layer. The first semiconductive polymer acts as a electron acceptor and the second semiconductive polymer acts as a hole acceptor. The first and second semiconductive polymers form respective continuous networks that interpenetrate so that there is a continuous path through each of the semiconductive polymers and a charge carrier within one of the first and second semiconductive polymers can travel between the first and second electrodes without having to cross into the other semiconductive polymer. However, these devices do not show the high efficiency that would be expected if the devices worked as ideally envisaged. This may be due to the fact that it is likely that at least one of the polymers can extend through the whole device, thereby creating a parallel system of single material diodes.

SUMMARY OF THE INVENTION

It is an object of the present invention to provide an improved photovoltaic device.

According to a first aspect of the invention there is provided a method of forming a photovoltaic or photoconducting device comprising the laminating together of a first component having a first electrode and a first semiconductive layer predominantly comprising a first semiconductive material, and a second component having a second electrode and a second semiconductive layer predominantly comprising a second semiconductive material, wherein the laminating step involves the controlled joining of said first semiconductive layer and said second semiconductive layer to form a mixed layer comprising proportionally less of said first semiconductive material than said first semiconductive layer and proportionally less of said second semiconductive material than said second semiconductive layer while retaining said first and second semiconductive layers with a reduced thickness.

According to another aspect of the invention there is provided a method of designing and creating a photovoltaic or photoconducting device comprising the steps of: choosing first and second semiconductive materials on the basis of their electronic properties so that said first semiconductive material acts as an electron donor and said second semiconductive material acts as an electron acceptor; forming a first component comprising a first electrode and a first semiconductive layer predominantly comprising said first semiconductive material; forming a second component comprising a second electrode and a second semiconductive layer predominantly comprising said second semiconductive material; and joining the first component to the second component by laminating said first semiconductive layer to said second semiconductive layer. The laminating step may involve the controlled joining of said first semiconductive layer and said second semiconductive layer to form a mixed layer comprising proportionally less of said first semiconductive material than said first semiconductive layer and proportionally less of said second semiconductive layer while retaining said first and second semiconductive layers with a reduced thickness.

Laminating may comprise the application of pressure or heat or pressure and heat. If heat is applied it may involve heating one or both of the semiconductive layers above their glass transition temperatures. The semiconductive layers may be individually treated before lamination, for example by organic or inorganic doping. Such treatment may vary the morphology, the light-absorption characteristics, the transport properties or the injection properties of one or both semiconductive layers. The thickness of the semiconductive layers before lamination may be controlled, for example by spin coating a solution of semiconductive material. Furthermore the thickness of the mixed layer and/or the thickness of the first and second semiconductive layers remaining may be controlled, for example by annealing.

According to a further aspect of the invention there is provided a photovoltaic or photoconducting device comprising: a first electrode; a first semiconductive layer, predominantly comprising a first semiconductive material, over at least part of said first electrode; a mixed layer over said first semiconductive layer; a second semiconductive layer, predominantly comprising a second semiconductive material, over said mixed layer; and a second electrode over at least part of said second semiconductive layer, wherein said mixed layer is connected with the first and second semiconductive layers and has proportionally less of said first semiconductive material than said first semiconductive layer and proportionally less of said second semiconductive material than said second semiconductive layer.

A first substrate may carry or comprise said first electrode and a second substrate may carry or comprise said second electrode. The first and second substrates are preferably self-supporting.

According to a still further aspect of the invention there is provided a photovoltaic or photoconducting device comprising: a first substrate carrying or comprising a first electrode and carrying a first semiconductive layer predominantly comprising a first semiconductive material; a second substrate carrying or comprising a second electrode and carrying a second semiconductive layer predominantly comprising a second semiconductive material; and a third mixed layer, arranged between and connected with the first and second semiconductive layers and having proportionally less of said first semiconductive material than said first semiconductive layer and proportionally less of said second semiconductive material than said second semiconductive layer.

According to any one of the different aspects of the invention, the mixed layer may be an interpenetrating network of the first and second semiconductive materials. The first, and likewise the second, semiconductive materials may comprise a mixture of component materials or a single component material. The first and second substrates and the first and second components may be self-supporting. The semiconductive materials may have the properties as defined in any one of the claims 20 to 36. The first and second semiconductive layers may have the properties, before and after lamination, as defined by claims 38 to 43. The first electrode may make physical contact with the first semiconductive layer, or one of a plurality of layers may be interposed between the first electrode and the first semiconductive layer. Likewise the second electrode may make physical contact with the second semiconductive layer, or one of a plurality of layers may be interposed between the second electrode and the second semiconductive layer. The electrodes may have the same or different work functions. An electrode may itself form one of the self-supporting substrates, or the electrode may be comprised in or carried by one of the self supporting substrates. Preferably one or both of the substrates transmit light. Furthermore, one or both of the substrates (and components) may be flexible.

Lamination techniques are well established, allowing devices to be made in a straightforward way, on a large scale, and at low costs.

The present invention provides for the treatment of the first semiconductive layer and/or second semiconductive layer before effecting lamination. This treatment was not possible in the prior art.

A device made according to the present invention is believed to help avoid the creation of a parallel system of diodes and gives improved performance over the device described in the previously referred to disclosure by Halls et al. The first and second semiconductive layers ensure that a single material does not extend from the first electrode to the second electrode.

A device made according to the present invention has a high efficiency to cost ratio.

Devices made according to the present invention have a high efficiency compared to the previously reported polymer blend device.

Devices made according to the invention make it possible to minimize the risk of forming pin holes or direct conductive paths from one electrode to the other. This is particularly advantageous in the production of large area devices.

As the device is not created in a layer by layer fashion the choice of suitable materials is increased as the effects of creating the second semiconductive layer over the first semiconductive layer in a layer by layer fashion are less critical. This affords greater flexibility in tailoring the device to absorb in specific wavelength regions and allows for a more efficient use of the spectrum when used as a solar cell. It also allows other properties of the device to be controlled or improved, such as its conductivity and serial resistance.

For a better understanding of the present invention and to understand how the same may be put into effect, reference will now be made by way of example only to the enclosed drawings.

DESCRIPTION OF THE PREFERRED EMBODIMENT

Figure 4A:
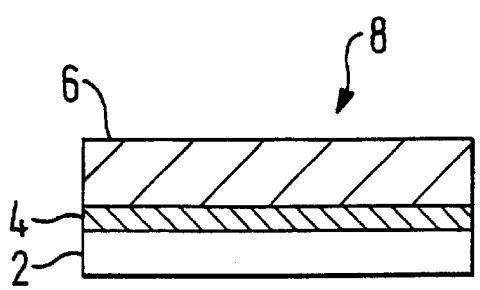
FIGS. 4a, 4b and 4c exemplify the method of the invention.
Figure 4B:
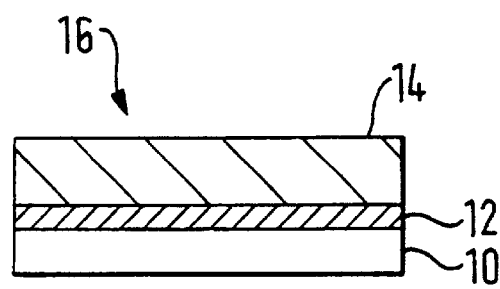
Figure 4C:
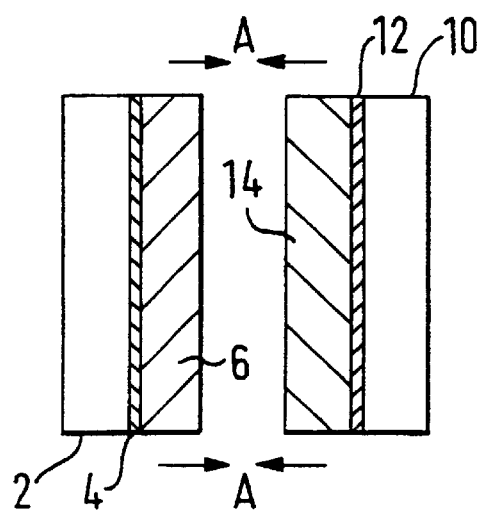
Figure 5:
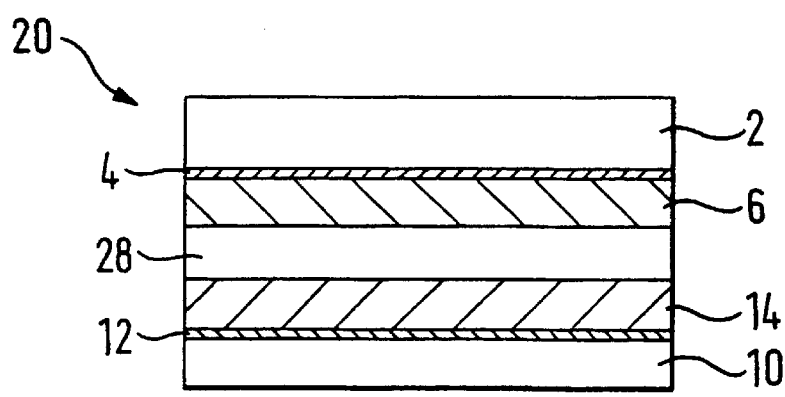
FIG. 5 is an exemplary structure of a device according to the invention.

FIGS. 4a, 4b, 4c and FIG. 5 illustrate the manufacture of a photovoltaic or photoconducting device 20. The device 20 has a first component part 8 and a second component part 16 which are laminated together as illustrated in FIG. 4c. The first component part 8 is illustrated in FIG. 4a and has a first self-supporting substrate 2, a first electrode 4 and a first semiconductive layer 6. The second component part 16 is illustrated in FIG. 4b and has a second self-supporting substrate 10, a second electrode 12 and a second semiconductive layer 14. On lamination, a mixed layer 28 containing material from the first and second semiconductive layers is formed at the interface of the first semiconductive layer 6 and the second semiconductive layer 14 as illustrated in FIG. 5.

The material of the first semiconductive layer 6 acts as an electron donor while the material of the second semiconductive layer 14 acts as an electron acceptor in this material combination. Semiconducting polymers which can act as electron acceptors are e.g. polymers, containing CN—or $CF_3$ groups like CN-PPV, MEH-CN-PPV, $CF_3$ substituted ones or Buckminsterfullerene ($C_{60}$) alone or functionalised to enhance solubility. Semiconducting polymers which do not contain such or other electron withdrawing groups can often act as hole acceptors, for instance the following polymers (and their derivatives) or copolymers containing units of the following polymers (and derivatives): poly (phenylene), poly(phenylene vinylene), poly(thiophene), poly(silane), poly(thienylene vinylene) and poly (isothianaphthene).

Other suitable semiconductive m ate rials include : organometallic polymers; phthalocyanines, perylenes, naphthalocyanines, squaraines, merocyanines and their respective derivatives; and azo-dyes consisting of azo chromofore (—N=N—) linking aromatic groups.

Other suitable semiconductive materials include perylene polymer, poly(squaraines) and organic molecules. Examples of semiconductive organic molecules include dyes and pigments, as described in U.S. Pat. No. 4,281,053, U.S. Pat. No. 4,164,431, U.S. Pat. No. 5,201,961, and U.S. Pat. No. 5,350,459.

The semiconductive layers may be formed from a blend of semiconductive materials including blends of polymers with polymers and blends of polymers with molecules.

The first substrate 2 and first electrode 4 and/or the second electrode 12 and the second substrate 10 are transparent to allow light to reach the mixed layer. On illumination the device is capable of supplying either electric power or—under applied bias voltage—a light dependent current.

Generally the electrodes have different work functions in order to induce an electric field across the device. However, when the device is used under reverse bias (externally applied voltage), the electrodes may have the same work function and be made of the same material. Examples of high work function materials are: Au, Ag, Co, Ni, Pt, C, doped poly(aniline), doped poly(ethylene dioxythiophene) and other poly(thiophene) derivatives, doped poly(pyrrole), indium tin oxide, fluorinated tin oxide, tin oxide and zinc oxide. Examples of low work function materials are Li, In, Al, Ca, Mg, Sm, Tb, Yb, Zr, and alloys of these. If a metal electrode is used, the metal itself can form both the self-supporting substrate and the electrode. An example of this is aluminium foil.

In the final device 20, the first and second semiconductive layers 6 and 14 are thick enough to prevent the mixed layer 28 being in direct contact with the electrodes but should otherwise be as thin as possible.

Although in the FIGS. 4a, 4b, 4c and 5 the first semiconductive layer 6 has been shown in physical contact with the first electrode 4 and the second semiconductive layer 14 has been shown in physical contact with the second electrode 12, such physical contact is not necessary for the operation of the device. One or more intermediate layers may lie between the first electrode 4 and first semiconductive layer 6. Likewise, one or more intermediate layers may lie between the second electrode 12 and the second semiconductive layer 14. These intermediate layers may be a layer of doped polyethylene dioxythiophene) , or poly (aniline) or a doped conjugated polymer. These layers are particularly useful on top of an indium tin oxide electrode where they protect the semiconducting layer from oxygen and other impurities emerging from the indium tin oxide. Other examples of intermediate layer materials are polymers incorporating triphenylene units which enhance hole transport and tris(8-quinolina to) aluminium (111) complexes ($Alq_3$) which enhances electron transport.

EMBODIMENT 1

Figure 1:
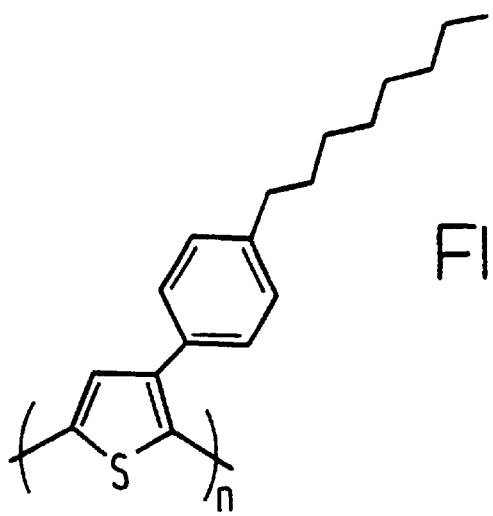
FIG. 1 is the chemical structure of the organic polymer POPT.

A first method of forming the device 20 will be explained with reference to FIG. 4a. A glass substrate 2 is covered with indium tin-oxide, ITO, to form the first electrode 4. The ITO surface is cleaned using acetone and methanol. An organic polymer solution is prepared by dissolving 10 milligrams of regioregular POPT (poly(3- (4-octylphenyl) thiophene)), the chemical structure of which is illustrated in FIG. 1, in 2 milliliters of chloroform. The solution is filtered with 0.45 micrometer filters and then spincoated onto the ITO surface to give a thickness of between 40 and 150 nm. The polymer covered substrate is then heated from room temperature to 230° C. at a rate of 4° C. per minute and maintained at 230° C. for 30 minutes. This heating occurs in a vacuum chamber with a gas pressure of below $10^{-5}$ torr and induces a phase transition in the POPT which shifts its absorption to longer wavelengths.

Figure 2:
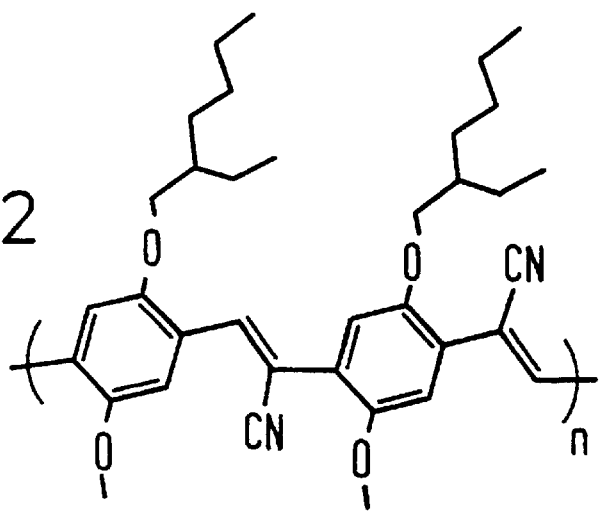
FIG. 2 is the chemical structure of the organic polymer MCP.

Referring to FIG. 4b, the formation of a second component part 16 will be described. The second electrode 12 is formed on the second substrate 10 by thermally evaporating aluminium onto a glass substrate. The second semiconductive layer 14 is formed over the aluminium electrode 12 by spincoating an organic polymer solution onto the aluminium coated substrate. The solution is formed by dissolving 10 mg of MCP (poly(2,5-bis(nitrilemethyl)-1-methoxy-4-(2'-ethylhexyloxy)benzene-co-2,5-dialdehyde-1-methoxy 4-(2'-ethylhexyloxy)benzene)), the structure of which is illustrated in FIG. 2, in 2 milliliters of chloroform and filtering the solution using 0.45 micrometer filters. The formation of the aluminium electrode 12 and the MCP semiconductive layer 14 is carried out in an inert gas atmosphere to avoid oxidation of the aluminium contacts.

After the individual manufacture of the first component part 8 and the second component part 16 they are laminated together to form the device 20 as indicated diagrammatically in FIG. 4c by the arrows A. The first component part 8, while at its elevated temperature, is aligned with the second component part so that the POPT semiconductive layer 6 and the MCP semiconductive layer 14 are opposed. The semiconductive layers are brought into contact and a pressure of approximately 30 kPa is applied for two to four minutes to laminate the component parts together. During lamination the POPT semiconductive layer 6 is at a temperature of approximately 230° C. which is above the glass transition temperature of POPT.

The thickness of the POPT layer 6 and the MCP layer 14, before lamination, can be controlled by varying the rotational speed at which the spincoating occurs. The film thickness when spincoating a solution is also determined by the solution's concentration, the temperature and the solvent used.

FIG. 5 illustrates the structure resulting from the lamination process. The POPT homolayer 6 and the MCP homolayer 14 interact to form the mixed layer 28. This layer comprises a mixture of POPT derived from the POPT layer 6 and MCP derived from the MCP layer 14. The first semiconductive layer 6 formed from POPT acts as a hole acceptor and the second semiconductive layer formed from MCP acts as an electron acceptor.

Figure 3:
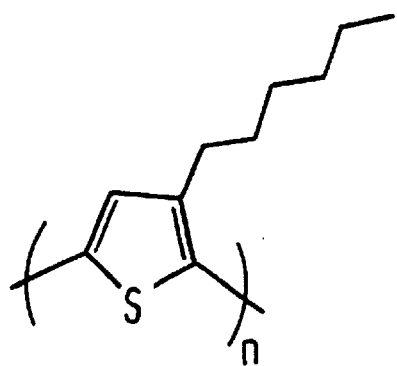
FIG. 3 is the chemical structure of the organic polymer P3HT.

The first semiconductive layer 6 can alternatively be formed from P3HT (regioregular poly(3-hexylthiophene)), the structural formula of which is illustrated in FIG. 3. 10 milligrams of this polymer is dissolved in 2 milliliters of chloroform and then filtered using 0.45 micrometer filters to create a polymer solution. This solution is spincoated over the ITO electrode 4. P3HT does not show the phase transition that is found in POPT. However, the first component part 8 is heated above its glass transition temperature to approximately 200° C. and laminated with the second component part 16 in the manner previously described. In the resulting device 20, the mixed layer 28 is a mixture of P3HT and MCP.

As another alternative to the use of MCP, a cyano-substituted poly(phenylene vinylene) derivative without the methylethylhexyloxy group could be used as electron accepting material in the second semiconductive layer 14 with either a poly(thiophene) derivative or a poly(phenylene vinylene) derivative as hole accepting material in the first semiconductive layer 6.

EMBODIMENT 2

In the second embodiment the first semiconductive layer 6 and the second semiconductive layer 14 are formed by a different method. Referring to FIG. 4a, the first semiconductive layer 6 is a polymer blend formed by dissolving 19 milligrams of POPT and 1 milligram of MCP in 4 milliliters of chloroform, filtering the solution using 0.45 micrometer filters, and spincoating the filtered solution on top of the indium tin oxide electrode 4. The second semiconductive layer 14 of the second component part 16 is also a polymer blend. This polymer blend is formed by dissolving 1 milligram of POPT and 19 milligrams of MCP in 4 milliliters of chloroform and filtering the solution using 0.45 micrometer filters. The polymer blend is then spincoated onto the aluminium electrode 12. The method is then the same as previously described. The first component part 8 is heated and the two component parts are laminated together to form the complete device 20.

In the first semiconductive layer 6, POPT predominates and the preferred ratio of POPT to MCP is 95% to 5% by weight. The efficiency of the finished device decreases as the percentage of MCP to POPT increases, however, good results are still obtained with a ratio of 80% POPT to 20 MCP by weight.

Likewise, in relation to the second semiconductive layer 14 MCP predominates and the preferred ratio of MCP to POPT is 95% to 5% by weight but it may also vary and good results are achieved with a ratio of 80% MCP to 20% POPT by weight.

FIG. 5 illustrates the structure resulting from the lamination process. The first blended semiconductive layer 6 and the second blended semiconductive layer 14 interact to form the mixed layer 28. This layer comprises a mixture derived from the first blended layer 6 and the second blended layer 14. The mixed layer 28 has a smaller %QOPT than the first blended layer 6 and a smaller %MCP than the second blended layer 14. POPT acts as a hole acceptor and MCP acts as an electron acceptor.

As an alternative to the use of POPT and MCP, POPT and MCP may be respectively replaced by a poly(thiophene) derivative and a cyano-substituted poly(phenylene vinylene) derivative.

According to the described methods, the separate first and second semiconductive layers can be individually treated before lamination. Such treatment may involve the inducement of a phase transition in a semiconductive polymer to vary its absorption characteristics, the ordering of the material to improve its transport properties or the doping of the material. Separate annealing of the two components 8 and 16 before their lamination together allows traces of solvent, water and oxygen to be removed. Selective doping (with molecular, polymeric or inorganic dopants) of each layer can represent a very powerful means to decrease the serial resistance and/or create or enhance internal electric fields. The bandgap of the semiconductor layers may be decreased or even removed depending on the degree of doping. Possible dedoping (neutralization) at the interface after the lamination of both substrates may lead to the (re)creation or change of a bandgap and/or transport properties which could enhance the efficiency of such a device. This has partly been discussed in Synthetic Metals 84 (1997) 477–482, Yoshino et al. With the present invention the donor and the acceptor material—and any underlying layers can be separately doped and optimized.

The mixed layer is formed by the diffusion of the first semiconductive layer into the second semiconductive layer, accordingly, the device 2 may be annealed after lamination in order to control the phase separation and the thickness of the mixed layer 16. This provides for an increase of the interfacial area in the finished device. The increase of interfacial area in the finished device between the material of the first semiconductive layer 6 and the material of the second semiconductive layer 14 can be significantly enhanced compared to a device produced by the deposition of layer upon layer.

In the preceding described methods solutions for coating the first and second semiconductive layers were made with a polymer to solvent ratio of 5 milligrams to 1 milliliter. However, this range is dependent upon the solubility of the polymer in the solution and can range from 0.1 milligrams per milliliter to 75 milligrams per milliliter, depending on the type of polymer used.

As an alternative to what has previously been described, the first substrate 2 and the second substrate 10 are formed from flexible plastics material. The first substrate 2 is heat stabilized polyester (PET) which is available commercially ready coated with ITO. The first electrode may alternatively be formed on the polyester substrate 2 by depositing indium tin oxide or forming a conductive polymer. To form a conductive polymer, a solution of poly(ethylene dioxythiophene)/polystyrene sulfonic acid is spin coated over the polyester substrate 2. A suitable solution is commercially available from Bayer AG, Germany. The electrically conducting polymer film makes a transparent electrode onto which the first semiconductive layer may be spin coated. The first semiconductive layer 6 is then formed over the electrode 4 as previously described in relation to FIG. 4. The second substrate 10 is also a heat stabilized polyester film. The second electrode 12 is formed by thermally evaporating a thin layer of aluminium onto the polyester film and the second semiconductive layer 14 is formed as previously described.

Figure 6:
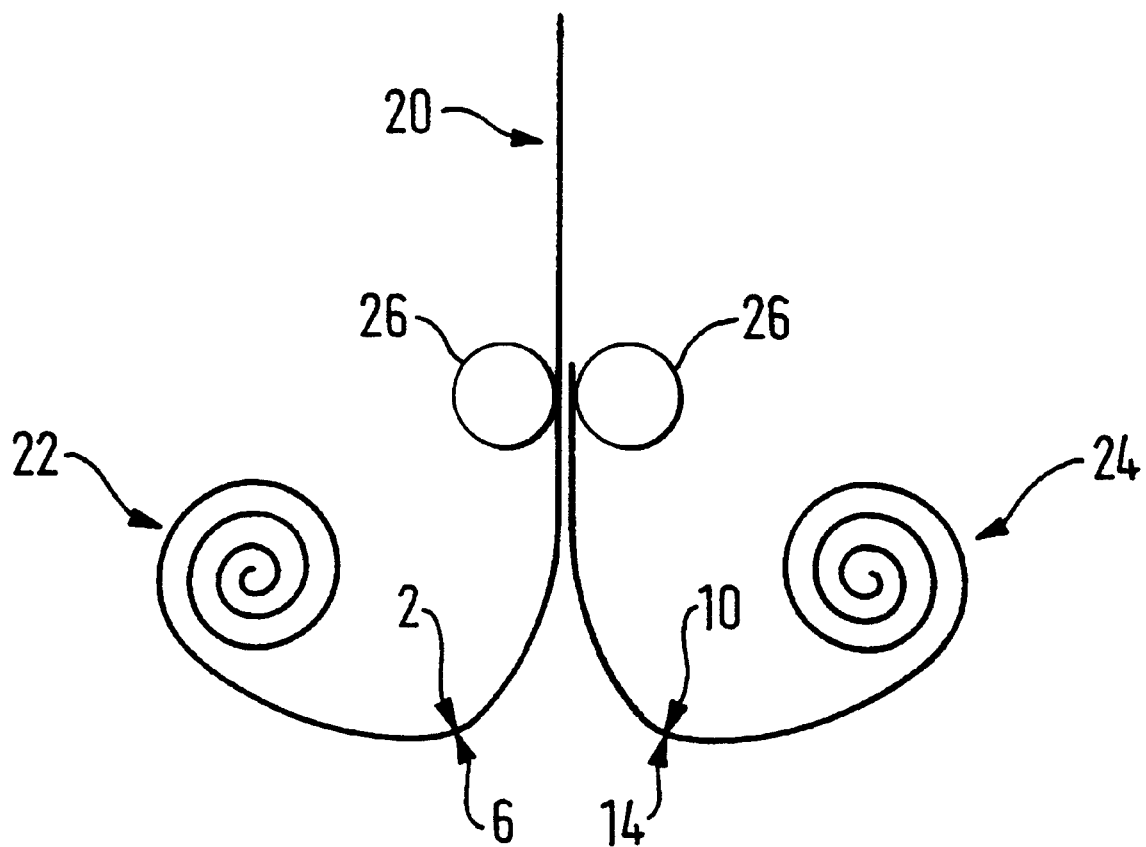
FIG. 6 is a diagram showing apparatus which is suitable for performing the method of the invention according to certain embodiments.

FIG. 6 illustrates an apparatus suitable for carrying out lamination of the first semiconductive layer to the second semiconductive layer. The first component part 8 can be supplied as a self-supporting film 2 carrying a first indium tin oxide electrode 4 and a first semiconductive layer 6 from a roll of film 22. The second component part 16 can be supplied as a self-supporting film 10 carrying a second aluminium electrode 12 and a second semiconductive layer 14 from a roll of film 24. The two self-supporting, coated films 8 and 16 are supplied to a pair of heated rollers 26 which laminate the films together to produce a continuous laminated multi-layer structure as illustrated in FIG. 5.

Alternatively, one or both of the flexible substrates 2 and 10 can be supplied from a roll. A substrate coming off the roll is continuously coated to form a component part. This may require the continuous sequential deposition of a layer to form an electrode followed by a semiconductive layer or, if the substrate already has an electrode, the continuous deposition of a semiconductive layer. One or both of the component parts can thus be continuously supplied to a pair of heated rollers 26 which laminate the component parts together to produce a continuous laminated multilayer structure as illustrated in FIG. 5.

The flexible substrates 2 and 10 may be formed from heat stabilized poly(ethylene terephthalate), poly(imide), poly (ether imide), poly(ethylene naphthalate), poly(carbonate), thin flexible sheets of glass and metal foil.

Although only a spin coating technique has been described for applying the first and second semiconductive layers onto the first and second components respectively it should be appreciated that different techniques can be used for example: spray coating, dip coating, roll coating, bead coating, meniscus coating, Langmuir-Blodgett techniques, screen printing and self-assembly techniques.

What is claimed is:

1. A method of forming a photovoltaic or photoconducting device comprising the laminating together of a first component having a first electrode and a first semiconductive layer predominantly comprising a first semiconductive material, and a second component having a second electrode and a second semiconductive layer predominantly comprising a second semiconductive material, wherein the laminating step involves the controlled joining of said first semiconductive layer and said second semiconductive layer to form a mixed layer comprising proportionally less of said first semiconductive material than said first semiconductive layer and proportionally less of said second semiconductive material than said second semiconductive layer while retaining said first and second semiconductive layers with a reduced thickness.

2. A method as claimed in claim 1, wherein the laminating step comprises the application of pressure and/or heat.

3. A method according to claim 2, wherein said application of heat comprises heating at least one of said first and second semiconductive layers above their glass transition temperature.

4. A method as claimed in claim 1, wherein the laminating step further comprises annealing.

5. A method as claimed in claim 1, further comprising the treatment of at least one of said first or second semiconductive layers before lamination by organic or inorganic doping.

6. A method according to claim 1, further comprising, before said lamination step, the treatment of at least one of said first or second semiconductive layers to vary their light-absorption characteristics and/or transport and injection properties.

7. A method as claimed in claim 1, wherein the first and second semiconductive layers are deposited by spin-coating and the thickness of said first semiconductive layer and the thickness of said second semiconductive layer are controlled by varying a rotation speed at which the spin-coating occurs.

8. A method as claimed in claim 1, wherein said first component is self-supporting and comprises first semiconductive material over a self-supporting substrate carrying or comprising the first electrode.

9. A method as claimed in claim 1, wherein said second component is self-supporting and comprises second semiconductive material over a self-supporting substrate carrying or comprising the second electrode.

10. A method as claimed in claim 1 wherein at least one of the components is flexible and stored as a roll and supplied therefrom for the laminating step.

11. A photovoltaic or photoconducting device comprising:
a first electrode;
a first semiconductive layer, predominantly comprising a first organic semiconductive material, over at least part of said first eletrode;
a mixed layer over said first semiconductive layer;
a second semiconductive layer, predominantly comprising a second organic semiconductive material, over said mixed layer; and
a second electrode over at least part of said second semiconductive layer, wherein said mixed layer is connected with the first and second semiconductive layers and comprises a mixture of said first and second semiconductive material having proportionally less of said first semiconductive material than said first semiconductive layer and proportionally less of said second semiconductive material than said second semiconductive layer.

12. A photovoltaic or photoconducting device as claimed in claim 11, wherein a first substrate carries or comprises said first electrode and a second substrate carries or comprises said second electrode.

13. A photovoltaic or photoconducting device as claimed in claim 12, wherein said first and second substrates are self-supporting.

14. A device as claimed in claim 12, wherein at least one of said first and second substrates is flexible.

15. A device as claimed in claim 12, wherein the first or/and second electrode itself forms the first or/and second substrates respectively.

16. A device as claimed in claim 15, wherein one of the substrates is a metal foil.

17. A device as claimed in claim 14, wherein the first and/or second substrate is arranged for the transmission of light.

18. A device as claimed in claim 13, wherein at least one of said first semiconductive material and said second semiconductive material comprise a mixture of component materials.

19. A device as claimed in claim 13, wherein at least one of said first semiconductive material and said second semiconductive material comprise a single component material.

20. A device as claimed in claim 13, wherein said first and second semiconductive materials are respectively hole acceptors and electron acceptors.

21. A device as claimed in claim 13, wherein at least one of said first and said second semiconductive materials comprises a semiconductive polymer.

22. A device as claimed in claim 21, wherein at least one of said first and second semiconductive materials comprises a conjugated polymer.

23. A device as claimed in claim 22 wherein at least one of the conjugated polymers is selected from the group consisting of:
poly(phenylene) and derivatives thereof, poly(phenylene vinylene) and derivatives thereof, poly(thiophene) and derivatives thereof, poly(thienylenevinylene) and derivatives thereof and poly(isothianaphthene) and derivatives thereof.

24. A device as claimed in claim 21, wherein at least one of the polymers is a poly(squaraine) or a derivative thereof.

25. A device as claimed in claim 21, wherein at least one of the polymers is a polymer containing perylene units.

26. A device as claimed in claim 13, wherein at least one of the semiconductive materials comprises an organic pigment or dye.

27. A device as claimed in claim 21, wherein at least one of the semiconductive materials comprises an organometallic polymer.

28. A device as claimed in claim 11 wherein at least one of the semiconductive materials comprises material selected from the group consisting of phthalocyanines, perylenes, naphthalocyanines, squaraines, merocyanines and their respective derivatives.

29. A device as claimed in claim 13, wherein at least one of the semiconductive materials comprises an azo-dye consisting of azo chromofore (—N=N—) linking aromatic groups.

30. A device as claimed in claim 11, wherein at least one of the semiconductive materials further comprises a poly (silane), or poly(germanate).

31. A device as claimed in claim 13, wherein the first or/and the second semiconductive material is doped with organic or inorganic dopants.

32. A device as claimed in any one of claim 13, wherein the first semiconductive material comprises POPT and said second semiconductive material comprises MCP.

33. A device as claimed in claim 13, wherein said first semiconductive material comprises P3HT and said second semiconductive material comprises MCP.

34. A device as claimed in claim 13, wherein said mixed layer is an interpenetrating network of said first and second semiconductive materials.

35. A device as claimed in claim 11 wherein said first semiconductive layer is more than 80% by weight said first semiconductive material.

36. A device as claimed in claim 35, wherein said first semiconductive layer is a homolayer of said first semiconductive material.

37. A device as claimed in claim 35, wherein said first semiconductive layer also contains said second semiconductive material.

38. A device as claimed in claim 11 wherein said second semiconductive layer is more than 80% by weight said second semiconductive material.

39. A device as claimed in claim 38, wherein said second semiconductive layer is a homolayer of said second semiconductive material.

40. A device as claimed in claim 38, wherein said second semiconductive layer also contains said first semiconductive material.

41. A device as claimed in claim 13, wherein one or a plurality of layers is between said first electrode and said first semiconductive layer.

42. A device as claimed in claim 13, wherein said first electrode is in physical contact with said first semiconductive layer.

43. A device as claimed in claim 13, wherein one or a plurality of layers is between said second electrode and said second semiconductive layer.

44. A device as claimed in claim 13, wherein said second electrode is in physical contact with said second semiconductive layer.

45. A device as claimed in claim 13, wherein said first electrode has a higher work function than said second electrode.

46. A device as claimed in claim 11 wherein said first electrode comprises indium tin oxide and said second electrode comprises aluminum.

47. A decice as claimed in claim 13, wherein first and second electrodes have substantially the same work function.

* * * * *

UNITED STATES PATENT AND TRADEMARK OFFICE
CERTIFICATE OF CORRECTION

PATENT NO. : 6,340,789 B1  Page 1 of 1
DATED : January 22, 2002
INVENTOR(S) : Petritsch et al.

It is certified that error appears in the above-identified patent and that said Letters Patent is hereby corrected as shown below:

Title page,
Item [30], Foreign Application Priority Data, the correct priority date is -- March 20, 1998 --.

Column 12,
Line 32, insert -- said -- after "wherein"

Signed and Sealed this

Thirtieth Day of July, 2002

Attest:

Attesting Officer

JAMES E. ROGAN
Director of the United States Patent and Trademark Office